(12) United States Patent
Zeng et al.

(10) Patent No.: US 11,848,388 B1
(45) Date of Patent: Dec. 19, 2023

(54) SILICON-CONTROLLED RECTIFIERS FOR ELECTROSTATIC DISCHARGE PROTECTION

(71) Applicant: GlobalFoundries Singapore Pte. Ltd., Singapore (SG)

(72) Inventors: Jie Zeng, Singapore (SG); Souvick Mitra, Essex Junction, VT (US)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/746,385

(22) Filed: May 17, 2022

(51) Int. Cl.
*H01L 29/87* (2006.01)
*H01L 29/06* (2006.01)
*H01L 29/66* (2006.01)

(52) U.S. Cl.
CPC .......... *H01L 29/87* (2013.01); *H01L 29/0649* (2013.01); *H01L 29/66121* (2013.01)

(58) Field of Classification Search
CPC . H01L 27/0262; H01L 27/0817; H01L 29/87; H01L 2924/13034; H01L 29/0649; H01L 29/66121
See application file for complete search history.

(56) References Cited

U.S. PATENT DOCUMENTS

| | | | |
|---|---|---|---|
| 7,786,507 B2 | 8/2010 | Denison et al. | |
| 8,553,380 B2 | 10/2013 | Salcedo | |
| 9,893,050 B2 | 2/2018 | Laine et al. | |
| 9,991,369 B2 | 6/2018 | Noh et al. | |
| 2016/0372455 A1* | 12/2016 | Zhong | H01L 29/083 |

OTHER PUBLICATIONS

Z. Liu, J. Vinson, L. Lou and J. J. Liou, "An Improved Bidirectional SCR Structure for Low-Triggering ESD Protection Applications," in IEEE Electron Device Letters, vol. 29, No. 4, pp. 360-362, doi: 10.1109/LED.2008.917111 (Apr. 2008).
Zeng, Jie et al., "Bi-Directional Bi-Polar Device for ESD Protection" filed Jul. 23, 2021 as a U.S. Appl. No. 17/383,445.

* cited by examiner

*Primary Examiner* — Wasiul Haider
(74) *Attorney, Agent, or Firm* — Thompson Hine LLP; Francois Pagette

(57) ABSTRACT

Structures for a silicon-controlled rectifier and methods of forming a structure for a silicon-controlled rectifier. The structure includes a first well and a second well in a semiconductor substrate. The first well has a first conductivity type, and the second well has a second conductivity type opposite to the first conductivity type. The structure further includes a first terminal having a doped region that has a portion in the first well, and a second terminal including a second doped region that has a portion in the first well and a third doped region in the second well. The first and second doped regions have the second conductivity type, the third doped region has the first conductivity type, and the second doped region is positioned in a lateral direction between the first doped region and the third doped region.

20 Claims, 4 Drawing Sheets

SILICON-CONTROLLED RECTIFIERS FOR ELECTROSTATIC DISCHARGE PROTECTION

BACKGROUND

The disclosure relates generally to semiconductor devices and integrated circuit fabrication and, more specifically, to structures for a silicon-controlled rectifier and methods of forming a structure for a silicon-controlled rectifier.

An integrated circuit may be exposed to random electrostatic discharge (ESD) events that can direct potentially large and damaging ESD currents to the sensitive devices of the integrated circuit. An ESD event refers to an unpredictable electrical discharge of a positive or negative current over a short duration and during which a large amount of current is directed to the integrated circuit. An ESD event may occur during post-manufacture chip handling or after chip installation on a circuit board or other carrier. The high current may originate from a variety of sources, such as the human body, a machine component, or a chip carrier.

Precautions may be taken to protect the integrated circuit from an ESD event. One such precaution is to incorporate an on-chip protection circuit that is designed to avert damage to the sensitive devices of the integrated circuit during an ESD event. If an ESD event occurs, a protection device of the protection circuit is triggered to enter a low-impedance state that conducts the ESD current to ground and thereby shunts the ESD current away from the integrated circuit. The protection device remains clamped in its low-impedance state until the ESD current is drained and the ESD voltage is discharged to an acceptable level.

A common type of protection device commonly deployed in an ESD protection circuit is a silicon-controlled rectifier (SCR). In its quiescent state, the SCR restricts current conduction to leakage current. However, a voltage pulse exceeded an engineered threshold, known as the trigger voltage, initiates the conduction of a forward current between the anode and cathode of the SCR. Even after the trigger voltage is removed, the SCR remains clamped to conduct the forward current so long as the forward current remains above an engineered holding current. When the forward current from the ESD event drops below the holding current, the SCR returns to its quiescent state.

Improved structures for a silicon-controlled rectifier and methods of forming a structure for a silicon-controlled rectifier are needed.

SUMMARY

In an embodiment, a structure for a silicon-controlled rectifier is provided. The structure comprises a first well and a second well in a semiconductor substrate. The first well has a first conductivity type, and the second well has a second conductivity type opposite to the first conductivity type. The structure further comprises a first terminal including a first doped region that has a portion in the first well, and a second terminal including a second doped region that has a portion in the first well and a third doped region in the second well. The first doped region and the second doped region have the second conductivity type, the third doped region has the first conductivity type, and the second doped region is positioned in a lateral direction between the first doped region and the third doped region.

In an embodiment, a method of forming a structure for a silicon-controlled rectifier is provided. The method comprises forming a first well in a semiconductor substrate, forming a second well in the semiconductor substrate, forming a first terminal that includes a first doped region having a portion in the first well, and forming a second terminal that includes a second doped region having a portion in the first well and a third doped region in the second well. The first well and the third doped region have a first conductivity type, the second well, the first doped region, and the second doped region have a second conductivity type opposite to the first conductivity type, and the second doped region is positioned in a lateral direction between the first doped region and the third doped region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
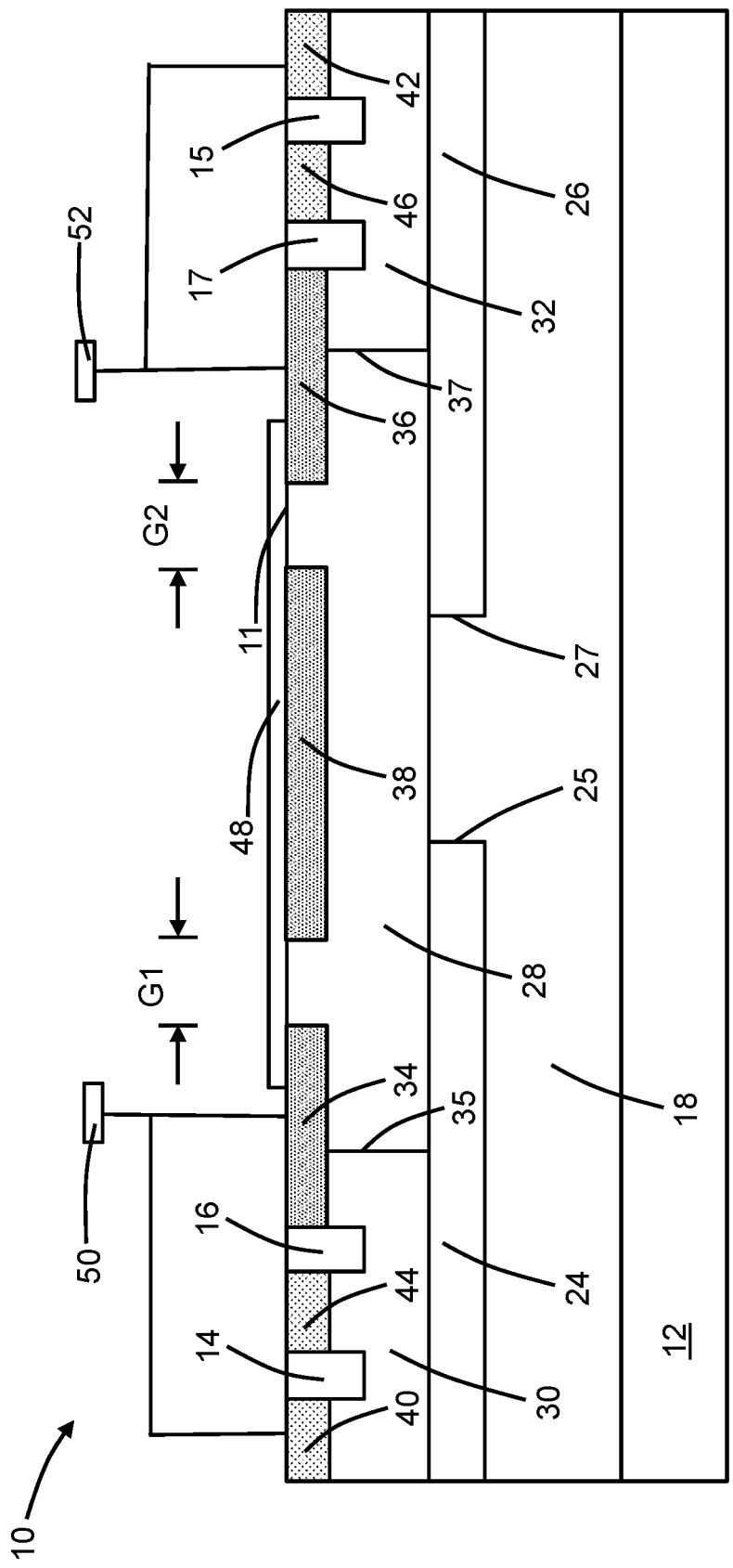
FIG. 1 is a cross-sectional view of a structure in accordance with embodiments of the invention.

With reference to FIG. 1 and in accordance with embodiments of the invention, a structure 10 for a silicon-controlled rectifier includes a semiconductor substrate 12, as well as shallow trench isolation regions 14, 15 and shallow trench isolation regions 16, 17 that are arranged in the semiconductor substrate 12. The semiconductor substrate 12 may be comprised of a semiconductor material, such as single-crystal silicon. The semiconductor substrate 12 may include a layer 18 as a portion that is positioned adjacent to a top surface 11 of the semiconductor substrate 12. The layer 18 may be formed by an epitaxial growth process. In an embodiment, the layer 18 may be doped to have n-type conductivity, and the portion of the semiconductor substrate 12 beneath the layer 18 may be doped to have p-type conductivity.

The shallow trench isolation regions 14, 15, 16, 17 may be formed by patterning shallow trenches in the semiconductor substrate 12 with lithography and etching processes, depositing a dielectric material, such as silicon dioxide, to fill the shallow trenches, and planarizing and/or recessing the deposited dielectric material. The shallow trench isolation region 14 is positioned adjacent to the shallow trench isolation region 16, and the shallow trench isolation region 15 is positioned adjacent to the shallow trench isolation region 17.

Drift wells 24, 26 are formed within the layer 18 of the semiconductor substrate 12. The drift wells 24, 26 are doped to have an opposite conductivity type from the layer 18. Although the drift well 24 is positioned adjacent to the drift well 26, the drift wells 24, 26 are not continuous. The drift well 26 is spaced in a lateral direction from the drift well 24 such that a portion of the layer 18 is positioned between the drift well 24 and the drift well 26 and the portion of the layer 18 provides the discontinuity separating the drift well 24 from the drift well 26. The drift wells 24, 26 are positioned in a vertical direction between the top surface 11 of the semiconductor substrate 12 and other portions of the layer 18.

The drift wells 24, 26 may be formed by introducing a dopant by, for example, ion implantation into the semiconductor substrate 12. A patterned implantation mask may be formed to define selected areas on the top surface 11 of the semiconductor substrate 12 that are exposed for implantation. The implantation mask may include a layer of an organic photoresist that is applied and patterned to form openings exposing the selected areas on the top surface 11 of the semiconductor substrate 12 and determining, at least in part, the location and horizontal dimensions of the drift wells 24, 26. The implantation mask has a thickness and stopping power sufficient to block implantation in masked areas. Implantation conditions (e.g., ion species, dose, kinetic energy) may be selected to tune the electrical and physical characteristics of the drift wells 24, 26. In an embodiment, the drift wells 24, 26 may be doped with a concentration of a p-type dopant (e.g., boron) to provide p-type conductivity.

A well 28 is formed in the layer 18 of the semiconductor substrate 12. The well 28 is positioned in a vertical direction between the top surface 11 of the semiconductor substrate 12 and a portion of the drift well 24, the top surface 11 of the semiconductor substrate 12 and a portion of the drift well 26, and the top surface 11 of the semiconductor substrate 12 and the portion of the layer 18 laterally between the drift wells 24, 26. The well 28 is doped to have a conductivity type that is opposite to the conductivity type of the drift wells 24, 26 and the same conductivity type as the layer 18. In an embodiment, the well 28 may be doped with a concentration of an n-type dopant (e.g., arsenic or phosphorus) to provide n-type conductivity.

The well 28 may be formed by introducing a dopant by, for example, ion implantation into the semiconductor substrate 12. A patterned implantation mask may be formed to define a selected area on the top surface 11 of the semiconductor substrate 12 that is exposed for implantation. The implantation mask may include a layer of an organic photoresist that is applied and patterned to form an opening exposing the selected area on the top surface 11 of the semiconductor substrate 12 and determining, at least in part, the location and horizontal dimensions of the well 28. The implantation mask has a thickness and stopping power sufficient to block implantation in masked areas. The implantation conditions (e.g., ion species, dose, kinetic energy) may be selected to tune the electrical and physical characteristics of the well 28.

Wells 30, 32 are formed in the layer 18 of the semiconductor substrate 12. The well 30 is positioned in a vertical direction between the drift well 24 and the top surface 11 of the semiconductor substrate 12, and the well 32 is positioned in a vertical direction between the drift well 26 and the top surface 11 of the semiconductor substrate 12. The wells 30, 32 are doped to have the same conductivity type as the drift wells 24, 26 but at a higher dopant concentration than the drift wells 24, 26. The wells 30, 32 may be formed by introducing a dopant of a given conductivity type by, for example, ion implantation into the semiconductor substrate 12. A patterned implantation mask may be formed to define selected areas on the top surface 11 of the semiconductor substrate 12 that are exposed for implantation. The implantation mask may include a layer of an organic photoresist that is applied and patterned to form openings exposing the selected areas on the top surface 11 of the semiconductor substrate 12 and determining, at least in part, the location and horizontal dimensions of the wells 30, 32. The implantation mask has a thickness and stopping power sufficient to block implantation in masked areas. The implantation conditions (e.g., ion species, dose, kinetic energy) may be selected to tune the electrical and physical characteristics of the wells 30, 32. In an embodiment, the wells 30, 32 may be doped with a concentration of a p-type dopant (e.g., boron) to provide p-type conductivity.

The well 28 is positioned in a lateral direction between the well 30 and the well 32. The well 30 adjoins the well 28 along an interface 35 defined at respective side edges that are abutting, and the well 32 adjoins the well 28 along another interface 37 defined at respective side edges that are also abutting. The interface 35 is positioned in a vertical direction between the drift well 24 and the top surface 11 of the semiconductor substrate 12, and the interface 37 is positioned in a vertical direction between the drift well 26 and the top surface 11 of the semiconductor substrate 12. The drift well 24 extends laterally inward to terminate at an edge 25, and the drift well 26 extends laterally inward to terminate at an edge 27. The edge 25 is separated from the edge 27 by a distance that is less than the distance separating the interface 35 from the interface 37. The well 28 is positioned in a vertical direction between the edges 25, 27 and the top surface 11 of the semiconductor substrate 12.

Doped regions 34, 36, 38 are formed adjacent to the top surface 11 of the semiconductor substrate 12. The doped regions 34, 36, 38 are positioned in a lateral direction between the shallow trench isolation region 16 and the shallow trench isolation region 17. The doped regions 34, 36, 38 may be doped to have an opposite conductivity type from the well 28, and the doped regions 34, 36, 38 may be doped to have the same conductivity type as the wells 30, 32 but at a higher dopant concentration. In an embodiment, the doped regions 34, 36, 38 may be doped (e.g., heavily doped) with a concentration of a p-type dopant (e.g., boron) to provide p-type conductivity. The doped regions 34, 36, 38 may be concurrently formed by selectively implanting ions, such as ions including the p-type dopant, with an implantation mask having openings defining the intended locations for the doped regions 34, 36, 38 in the semiconductor substrate 12.

The doped region 34 is positioned adjacent to the shallow trench isolation region 16 and, in an embodiment, may adjoin the shallow trench isolation region 16. The doped region 34 extends laterally across (i.e., bridges) the junction along the interface 35 between the well 28 and the well 30. A portion of the doped region 34 is positioned inside the well 28 and a different portion of the doped region 34 is positioned inside the well 30. As a result, the interface 35 is positioned in a vertical direction between the drift well 24 and the doped region 34.

The doped region 36 is positioned adjacent to the shallow trench isolation region 17 and, in an embodiment, may adjoin the shallow trench isolation region 17. The doped region 36 extends laterally across (i.e., bridges) the junction along the interface 37 between the well 28 and the well 32. A portion of the doped region 36 is positioned inside the well 28 and a different portion of the doped region 36 is positioned inside the well 32. As a result, the interface 37 is positioned in a vertical direction between the drift well 26 and the doped region 36.

The doped region 38 is positioned in a lateral direction between the doped region 34 and the doped region 38. The doped region 38 has a spaced relationship with each of the doped regions 34, 36. In an embodiment, the doped region 38 may be centered between the doped region 34 and the doped region 36. In an embodiment, the doped region 38 may be centered between the shallow trench isolation region 16 and the shallow trench isolation region 17. The doped region 38 is surrounded by the well 28, and the doped region 38 is separated from the doped regions 34, 36 by respective portions of the well 28. The doped region 38 is positioned in the vertical direction between the edges 25, 27 of the drift wells 24, 26 and the top surface 11 of the semiconductor substrate 12.

Doped regions 40, 44 are formed in the well 30 adjacent to the top surface 11 of the semiconductor substrate 12, and doped regions 42, 46 are formed in the well 32 adjacent to the top surface 11 of the semiconductor substrate 12. The doped regions 40, 44 may be doped to an opposite conductivity type from the well 30, and the doped regions 42, 46 may be doped to have an opposite conductivity type from the well 32. In an embodiment, the doped regions 40, 42, 44, 46 may be doped (e.g., heavily doped) with a concentration of an n-type dopant (e.g., arsenic or phosphorus) to provide n-type conductivity. The doped regions 40, 42, 44, 46 may be concurrently formed by selectively implanting ions, such as ions including the n-type dopant, with an implantation mask having openings defining the intended locations for the doped regions 40, 42, 44, 46 in the semiconductor substrate 12.

The doped regions 34, 36, 38 are laterally positioned between the doped regions 40, 44 and the doped regions 42, 46. The doped region 34 is positioned in a lateral direction between the doped regions 40, 44 and the doped region 38, and the doped region 36 is positioned in a lateral direction between the doped regions 42, 46 and the doped region 38. The shallow trench isolation regions 14, 16 and the doped region 44 are positioned in a lateral direction between the doped region 34 and the doped region 40, the doped region 40 is positioned adjacent to the shallow trench isolation region 14, and the doped region 34 is positioned adjacent to the shallow trench isolation region 16. The shallow trench isolation regions 15, 17 and the doped region 46 are positioned in a lateral direction between the doped region 36 and the doped region 42, the doped region 42 is positioned adjacent to the shallow trench isolation region 15, and the doped region 36 is positioned adjacent to the shallow trench isolation region 17.

The doped region 44 is positioned in a lateral direction between the shallow trench isolation region 14 and the shallow trench isolation region 16, and the doped region 46 is positioned in a lateral direction between the shallow trench isolation region 15 and the shallow trench isolation region 17. The doped region 44 provides electrical isolation between the doped region 34 and the doped region 40, and the doped region 46 provides electrical isolation between the doped region 34 and the doped region 42.

A dielectric layer 48 is formed as a silicide-blocking layer. The dielectric layer 48 may be comprised of, for example, silicon nitride that is deposited on the top surface 11 of the semiconductor substrate 12 and then patterned by lithography and etching processes. The dielectric layer 48 has an overlapping relationship with the doped region 38 and portions of the well 28 in the gaps G1, G2, the dielectric layer 48 has a non-overlapping relationship with the doped regions 40, 42, 44, 46, and the dielectric layer 48 has a partially-overlapping relationship with the doped regions 34, 36.

Middle-of-line processing and back-end-of-line processing follow, which includes formation of an interconnect structure with electrical connections coupled to the structure 10. In particular, a silicide layer is formed on portions of the top surface 11 not covered by the dielectric layer 48 to facilitate an electrical connection to the doped regions 34, 40 and a separate electrical connection to the doped regions 36, 42. The dielectric layer 48 blocks the formation of silicide on the top surface 11 over, and adjacent to, the doped region 38, which is electrically floating in the completed structure 10.

The structure 10 may embody a fully-isolated symmetrical bidirectional device structure for a silicon-controlled rectifier that is suitable for use as electrostatic discharge protection device. The doped regions 34, 40 may provide a terminal 50 of the structure 10, and the doped regions 36, 42 may provide another terminal 52 of the structure 10.

In use, the structure 10 may be characterized by multiple current paths when triggered by the occurrence of an electrostatic discharge event that is received at the terminal 50. The current of the electrostatic discharge event is initially directed from the doped region 34 of the terminal 50 to the doped region 36 of the terminal 52 in a triggered PNP current path proximate to the top surface 11 of the semiconductor substrate 12 and in another triggered PNP current path through the well 28. The floating doped region 38 may function to reduce the on-resistance of the triggered PNP current path proximate to the top surface 11 of the semiconductor substrate 12. As the current level increases, the current may be directed to the terminal 52 in a subsequently-triggered, deeper PNPN current path from the doped region 34 of the terminal 50 through the well 28, drift well 26, and well 32 to the doped region 42 of the terminal 52.

Because the device structure is bi-directional, the structure 10 may alternatively be characterized by multiple current paths when triggered by the occurrence of an electrostatic discharge event that is received at the terminal 52. The current of the electrostatic discharge event is initially directed from the doped region 36 of the terminal 52 to the doped region 34 of the terminal 50 in a triggered PNP current path proximate to the top surface 11 of the semiconductor substrate 12 and in another triggered PNP current path through the well 28. The floating doped region 38 may function to reduce the on-resistance of the triggered PNP current path proximate to the top surface 11 of the semiconductor substrate 12. As the current level increases, the current may be directed to the terminal 50 in a subsequently-triggered, deeper PNPN current path from the doped region 36 of the terminal 52 through the well 28, drift well 24, and well 30 to the doped region 40 of the terminal 50.

The structure 10 may be characterized by a high holding voltage and a high holding current that are enhanced by the multiple current paths associated with the triggering mechanism, which may lead to an improvement in latch-up immunity.

Figure 2:
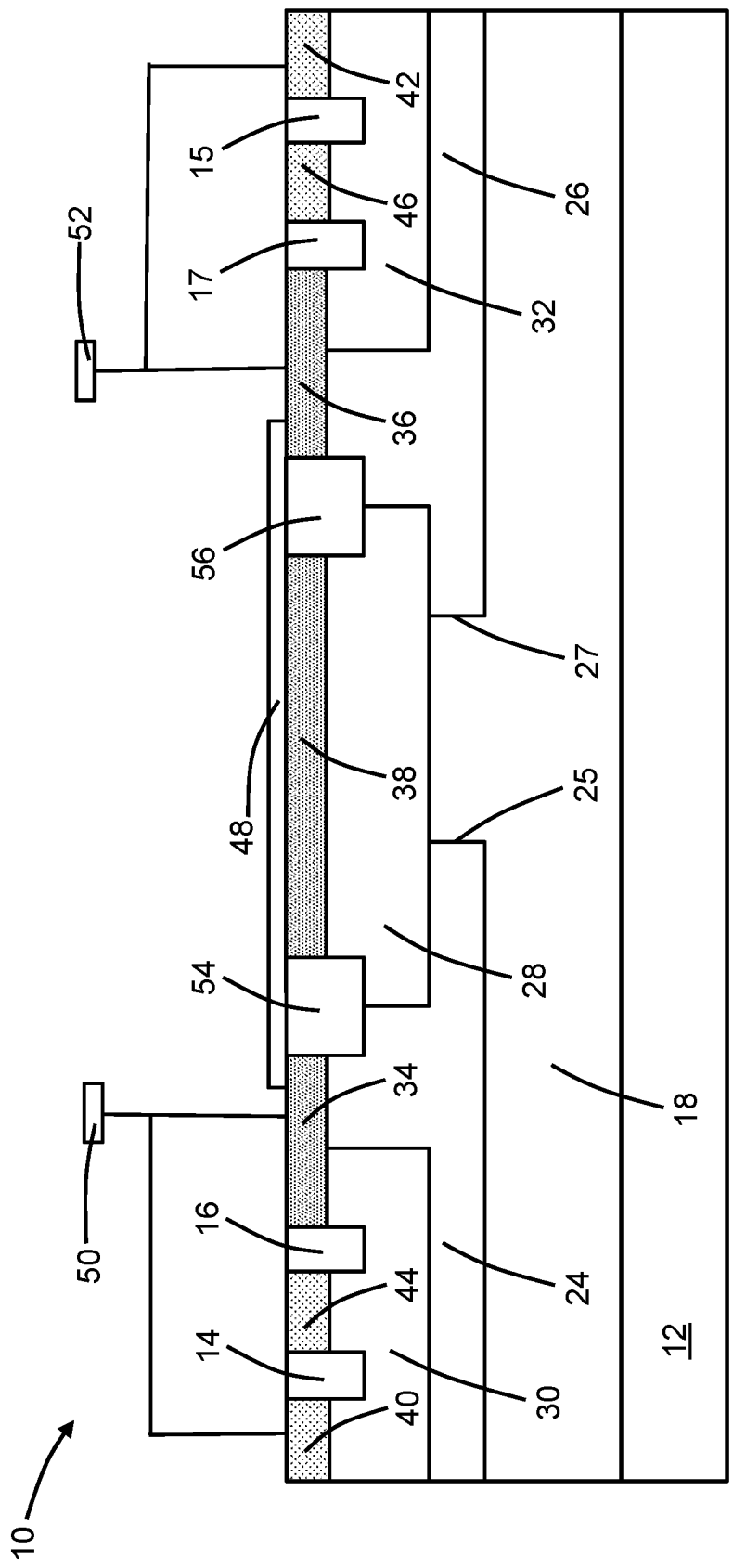
FIG. 2 is a cross-sectional view of a structure in accordance with alternative embodiments of the invention.

With reference to FIG. 2 in which like reference numerals refer to like features in FIG. 1 and in accordance with alternative embodiments of the invention, a shallow trench isolation region 54 may be laterally positioned between the doped region 34 and the doped region 38, and a shallow trench isolation region 56 may be laterally positioned between the doped region 36 and the doped region 38. The shallow trench isolation regions 54, 56 may be comprised of a dielectric material, such as silicon dioxide, and may be formed in the same manner as, and concurrently with, the shallow trench isolation regions 14, 15, 16, 17. The well 28 may be narrowed such that the opposite side edges of the well 28 are positioned beneath the shallow trench isolation regions 54, 56, and such that the well 28 does not adjoin either of the wells 30, 32. A portion of the drift well 24 laterally separates the well 28 from the well 30, and a portion of the drift well 26 laterally separates the well 32 from the well 30.

Figure 3:
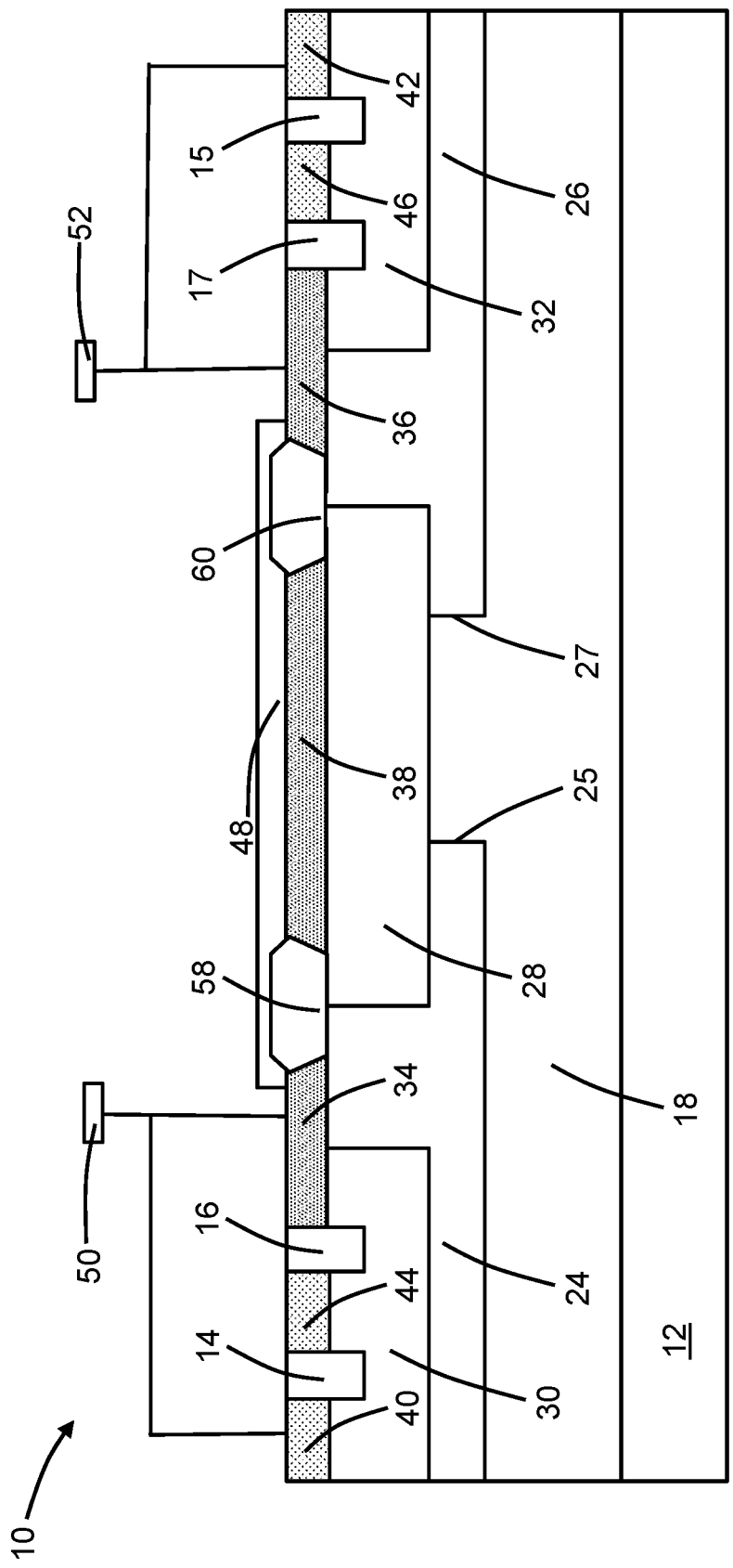
FIG. 3 is a cross-sectional view of a structure in accordance with alternative embodiments of the invention.

With reference to FIG. 3 in which like reference numerals refer to like features in FIG. 3 and in accordance with alternative embodiments of the invention, the shallow trench isolation regions 54, 56 may be replaced by isolation regions 58, 60 that are comprised of a dielectric material, such as silicon dioxide. The isolation regions 58, 60 may be formed separately from the shallow trench isolation regions 14, 15, 16, 17 and by a different technique, such as a local oxidation of silicon (LOCOS) technique.

Figure 4:
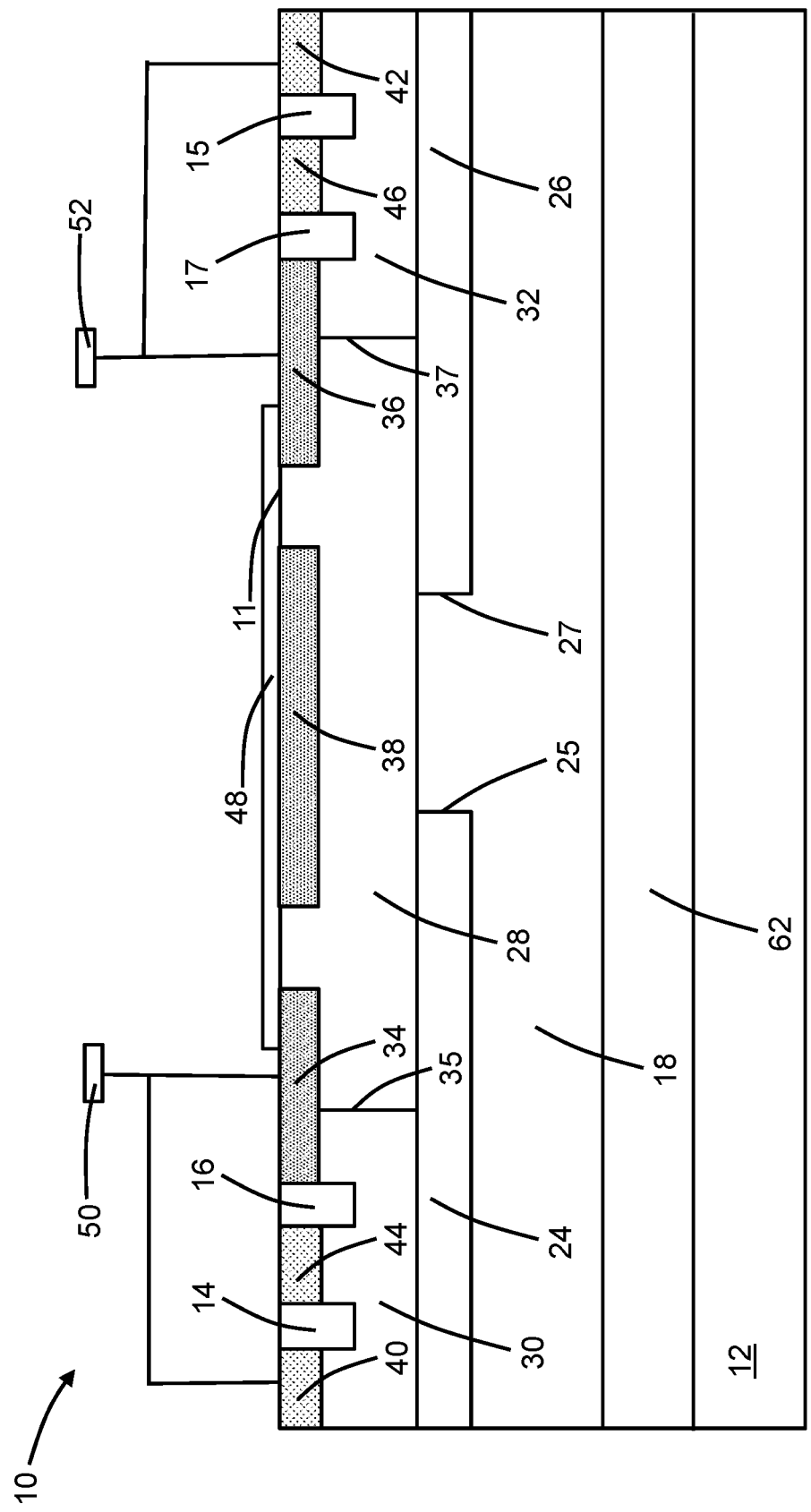
FIG. 4 is a cross-sectional view of a structure in accordance with alternative embodiments of the invention.

With reference to FIG. 4 in which like reference numerals refer to like features in FIG. 1 and in accordance with alternative embodiments of the invention, a buried doped layer 62 may be added between the portion of the semiconductor substrate 12 provided by the layer 18 and the oppositely-doped portion of the semiconductor substrate 12. In an embodiment, the buried doped layer 62 may be doped to have the same conductivity type as the layer 18 but at a higher dopant concentration.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a silicon-controlled rectifier, the structure comprising:
   a semiconductor substrate;
   a first well in the semiconductor substrate, the first well having a first conductivity type;
   a second well in the semiconductor substrate, the second well having a second conductivity type opposite to the first conductivity type;
   a first terminal including a first doped region that has a first portion in the first well, the first doped region having the second conductivity type;
   a second terminal including a second doped region that has a first portion in the first well and a third doped region in the second well, the second doped region having the second conductivity type, the third doped region having the first conductivity type, and the second doped region positioned in a lateral direction between the first doped region and the third doped region; and
   a fourth doped region in the first well, the fourth doped region having the second conductivity type, and the fourth doped region positioned in the lateral direction between the first doped region and the second doped region.

2. The structure of claim 1 wherein the second doped region has a second portion in the second well, the second well adjoins the first well along an interface, and the second doped region overlaps with the interface.

3. The structure of claim 1 further comprising:
   a third well in the semiconductor substrate, the third well having the second conductivity type,
   wherein the first terminal includes a fifth doped region in the third well, the fifth doped region has the first conductivity type, and the first doped region is positioned in the lateral direction between the fifth doped region and the second doped region.

4. The structure of claim 3 wherein the first doped region has a second portion in the third well, the third well adjoins the first well along an interface, and the first doped region overlaps with the interface.

5. The structure of claim 1 wherein the first conductivity type is n-type, and the second conductivity type is p-type.

6. The structure of claim 1 wherein the semiconductor substrate has a top surface, and further comprising:
   a dielectric layer on the top surface of the semiconductor substrate, the dielectric layer having an overlapping relationship with the fourth doped region and a non-overlapping relationship with the third doped region.

7. The structure of claim 1 further comprising:
   a first isolation region in the semiconductor substrate, the first isolation region positioned in the lateral direction between the first doped region and the fourth doped region; and a second isolation region in the semiconductor substrate, the second isolation region positioned in the lateral direction between the second doped region and the fourth doped region,
wherein the first isolation region and the second isolation region are comprised of a dielectric material.

8. The structure of claim 1 wherein the first well includes a first portion positioned in the lateral direction between the first doped region and the fourth doped region, and the first well includes a second portion positioned in the lateral direction between the second doped region and the fourth doped region.

9. The structure of claim 1 further comprising:
a shallow trench isolation region in the semiconductor substrate, the shallow trench isolation region positioned in the lateral direction between the second doped region and the third doped region.

10. The structure of claim 1 wherein the semiconductor substrate has a top surface, and further comprising:
a third well in the semiconductor substrate, the third well having the second conductivity type,
wherein the first well is positioned in a vertical direction between a first portion of the third well and the top surface, and the second well is positioned in the vertical direction between a second portion of the third well and the top surface.

11. The structure of claim 10 wherein the third well has a lower dopant concentration than the second well.

12. The structure of claim 10 wherein the second well adjoins the first well along an interface, and the interface between is positioned between the third well and the top surface of the semiconductor substrate.

13. The structure of claim 10 wherein the third well terminates in the lateral direction at an edge, and the first well is positioned in the vertical direction between the edge of the third well and the top surface of the semiconductor substrate.

14. A structure for a silicon-controlled rectifier, the structure comprising:
a semiconductor substrate;
a first well in the semiconductor substrate, the first well having a first conductivity type;
a second well in the semiconductor substrate, the second well having a second conductivity type opposite to the first conductivity type;
a first terminal including a first doped region that has a first portion in the first well, the first doped region having the second conductivity type;
a second terminal including a second doped region that has a first portion in the first well and a third doped region in the second well, the second doped region having the second conductivity type, the third doped region having the first conductivity type, and the second doped region positioned in a lateral direction between the first doped region and the third doped region; and
a fourth doped region in the second well, the fourth doped region having the first conductivity type, and the fourth doped region positioned in the lateral direction between the second doped region and the third doped region.

15. The structure of claim 14 further comprising:
a first shallow trench isolation region in the semiconductor substrate; and
a second shallow trench isolation region in the semiconductor substrate,
wherein the first shallow trench isolation region is positioned in the lateral direction between the second doped region and the fourth doped region, and the second shallow trench isolation region is positioned in the lateral direction between the third doped region and the fourth doped region.

16. The structure of claim 14 further comprising:
a fifth doped region in the first well, the fifth doped region having the second conductivity type, and the fifth doped region positioned in the lateral direction between the first doped region and the second doped region.

17. The structure of claim 14 wherein the second doped region has a second portion in the second well, the second well adjoins the first well along an interface, and the second doped region overlaps with the interface.

18. A method of forming a structure for a silicon-controlled rectifier, the structure comprising:
forming a first well in a semiconductor substrate;
forming a second well in the semiconductor substrate;
forming a first terminal that includes a first doped region having a first portion in the first well;
forming a second terminal that includes a second doped region having a first portion in the first well and a third doped region in the second well; and
forming a fourth doped region in the first well,
wherein the first well and the third doped region have a first conductivity type, the second well, the first doped region, the second doped region, and the fourth doped region have a second conductivity type opposite to the first conductivity type, and the second doped region is positioned in a lateral direction between the first doped region and the third doped region, and the fourth doped region is positioned in the lateral direction between the first doped region and the second doped region.

19. The method of claim 18 wherein the semiconductor substrate has a top surface, and further comprising:
forming a dielectric layer on the top surface of the semiconductor substrate,
wherein the dielectric layer has an overlapping relationship with the fourth doped region and a non-overlapping relationship with the first doped region and the second doped region.

20. The method of claim 19 further comprising:
forming a first isolation region in the semiconductor substrate; and
forming a second isolation region in the semiconductor substrate,
wherein the first isolation region positioned in the lateral direction between the first doped region and the fourth doped region, the second isolation region positioned in the lateral direction between the second doped region and the fourth doped region, and the first isolation region and the second isolation region are comprised of a dielectric material.

* * * * *